(12) United States Patent
Chen et al.

(10) Patent No.: US 6,916,674 B2
(45) Date of Patent: Jul. 12, 2005

(54) METHOD FOR FABRICATING MULTIPLE THICKNESS INSULATOR LAYERS

(75) Inventors: Pang-Shiu Chen, Hsinchu (TW); Buo-Chin Hsu, Yunghe (TW); Chee-Wee Liu, Taipei (TW)

(73) Assignee: Industrial Technology Research Institute, Hsinchu (TW)

(*) Notice: Subject to any disclaimer, the term of this patent is extended or adjusted under 35 U.S.C. 154(b) by 69 days.

(21) Appl. No.: 10/704,632

(22) Filed: Nov. 12, 2003

(65) Prior Publication Data

US 2004/0152225 A1 Aug. 5, 2004

Related U.S. Application Data

(60) Provisional application No. 60/444,642, filed on Feb. 4, 2003.

(51) Int. Cl.$^7$ .............................................. H01L 21/00
(52) U.S. Cl. ........................................................ 438/24
(58) Field of Search ......................... 438/507, 46, 24, 438/21; 257/59, 34, 19, 17, 14

*Primary Examiner*—Craig A. Thompson
*Assistant Examiner*—Monica D. Harrison
(74) *Attorney, Agent, or Firm*—Bacon & Thomas PLLC

(57) ABSTRACT

The present invention discloses a method for fabricating multiple-thickness insulator layers via strain field generated by stress. The strain field is used for alternating a develop mechanism of insulator layers on the quantum dots. By forming the multiple-thickness insulator layers at various developing rates, not only leakage current is prevented, but also components are kept isolated in the nano-electronics components. In nano-electronics manufacturing, the method for fabricating multiple-thickness insulator layers results in both better product reliability and the yield rate. It is potential for integral circuit manufacturing.

16 Claims, 5 Drawing Sheets

METHOD FOR FABRICATING MULTIPLE THICKNESS INSULATOR LAYERS

FIELD OF THE INVENTION

The present invention relates to a method for fabricating multiple insulator layers for manufacturing nano-electronics components. The method alternates a develop mechanism of insulator layers on the quantum dots via strain field generated by stress and forms multiple thickness insulator layers.

BACKGROUND OF THE INVENTION

In the semiconductor integral circuit manufacturing process for nano-electronics components and light detectors, an insulator layer is a critical element in preventing current leakage and keeping components isolated. In the prior art, technologies related to multi-quantum dots layers mainly focuses on developing germanium quantum dots on the silicon substrate, whereby the speed and efficiency of silicon-based optical electronic integral circuit (OEIC) devices can be enhanced. Such technologies are desirable in implementing LEDs (Light Emitting Diode) and light detectors, and effectively increase the performance of LEDs and light detectors. However, in the prior art, properties and behaviors of the germanium quantum dots developed on the silicon substrate have not been comprehensively researched. Accordingly, the performance of manufacturing process in field application based on such technologies has not been optimized.

The U.S. Pat. No. 5,354,707 titled "Method of Making Semiconductor Quantum Dot Light Emitting/Detecting Devices" is incorporated herein by reference. Refers to FIGS. 1A, 1B, 1C, and 1D, schematic sectional views at each formation step are described according to an embodiment of the aforementioned US patent. A silicon substrate 10 is illustrated in FIG. 1A. A micro epitaxial silicon substrate 15 is formed on the silicon substrate 10 in FIG. 1B. Then, at least one quantum dot 20 is formed on the micro epitaxial silicon substrate 15 in FIG. 1C. Another micro epitaxial silicon substrate 25 is formed on the micro epitaxial silicon substrate 15 where at least one quantum dot 20 is formed. The micro epitaxial silicon substrate 25 covers said at least one quantum dot 20. The formation and the application of said quantum dots 20 are limited in the prior art. Also, in the same prior art, details related to insulator layers are not mentioned.

In addition, drawbacks of the prior art are detailed as follows:
1. The prior art insulator layer is required to provide properties of dielectric materials;
2. The prior art can not provide protection over germanium quantum dot and micro epitaxial silicon;
3. The prior art has effects on the optical properties of the silicon-germanium elements.

According to the above, it is noted that the prior art fails to meet the requirements of the designs and the applications of the insulator layers. Therefore, the present invention provides solutions to overcome the drawbacks of the prior art, and optimize the application of the insulator layers.

SUMMARY OF THE INVENTION

The present invention discloses a method for fabricating multiple-thickness insulator layers. Appropriate layers are formed and applied in the manufacturing process via stress provided by different materials. Such implementation is accomplished due to the different stress derived from the atomic volumes between the germanium and silicon fabricating material (about 4.2% difference). Therefore, thickness of insulator layers is made different in the subsequent semiconductor manufacturing process. Further, strain field generated from different stress is used for fabricating multiple-thickness insulator layers upon repetition of the aforementioned process.

In addition, a substrate formed by self-assembled quantum dots is applied according to the present invention, whereby areas of different stress are generated on the substrate. After the formation of such substrate, an insulator dielectric layer is formed on the substrate by applying the method of Liquid Phase Deposition (LPD). The LPD method unitizes the difference of the stress for providing different insulator layers developing rates. The atomic radius of the germanium atom receives tensile stress from the top of the self-assembled germanium quantum dot system. Different stress results in different developing rates of an insulator layer. Multiple-thickness insulator layers are formed by enhanced developing rate from tensile stress. Accordingly, multiple insulator layers of different thickness are fabricated by applying different deposition time.

The invention can be more fully understood by reading the following detailed description of the preferred embodiments, with reference made to the accompanying drawings.

DETAILED DESCRIPTION OF THE PREFERRED EMBODIMENTS

Refers to FIGS. 2A, 2B, 2C, 2D, 2E, and 2F, a semiconductor manufacturing process is described. The manufacturing process is used for fabricating multiple insulator layers in manufacturing nano-electronics according to the present invention. According to FIGS. 2A, 2B, 2C, 2D, 2E, and 2F, the profile of multiple insulator layers at each formation step is illustrated, wherein multiple insulator layers are formed via strain field generated by different stress of quantum dots. A P-type fabricating material 100 is provided in FIG. 2A. The P-type fabricating material is made of a material selected from the group consisting of carbon family, silicon family, germanium family and tin family. It follows that appropriate trivalent elements such as boron, aluminum, and gallium are deposited, doped or sputtered on the P-type fabricating material for forming a P-type substrate. After the formation of such substrate, The process moves to the step described in the FIG. 2B, where a buffer layer 200 less than thickness of 50 nm is formed on the P-type fabricating material 100 via appropriate semiconductor manufacturing process. At the step, the buffer layer is made of epitaxial silicon.

Figure 1A:
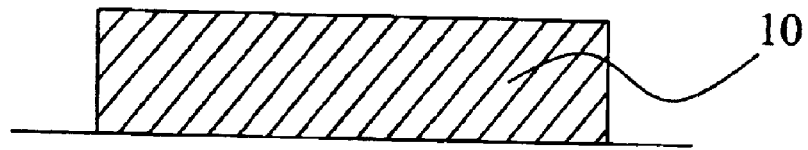
FIGS. 1A, 1B, 1C, and 1D are schematic sectional views illustrating the profile of insulator layers at each formation step according to prior art.
Figure 1B:
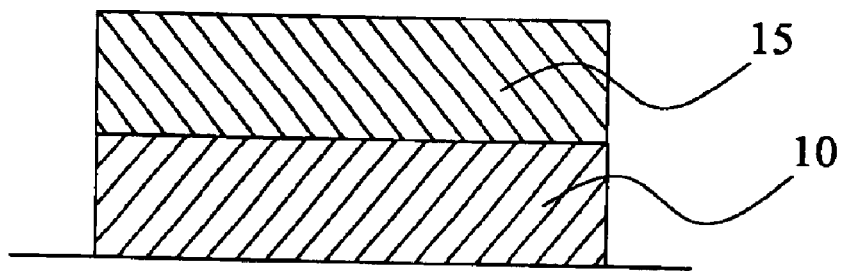
Figure 1C:
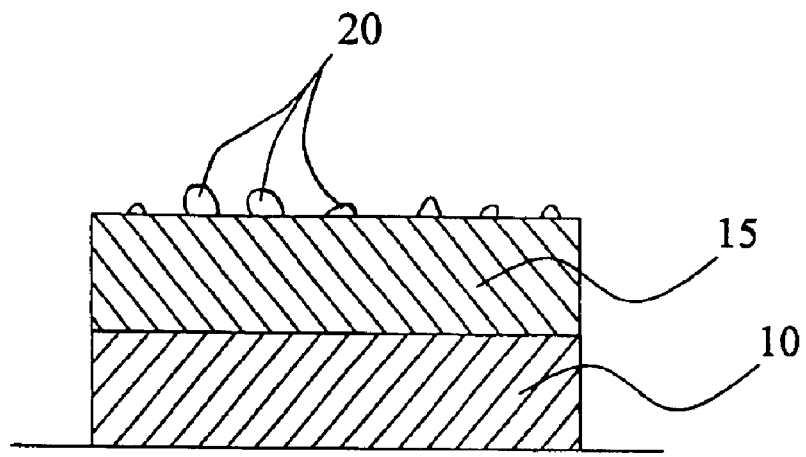
Figure 1D:
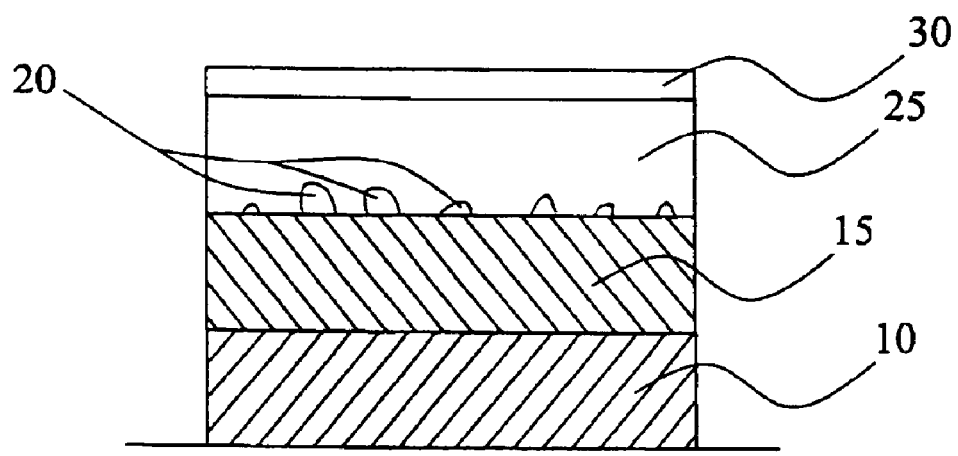
Figure 2A:
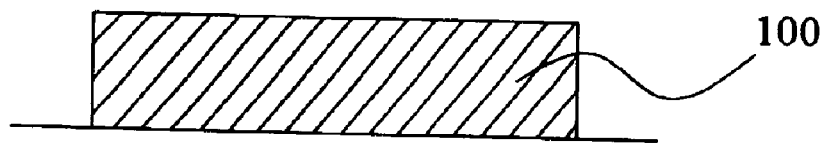
FIGS. 2A, 2B, 2C, 2D, 2E, and 2F are schematic sectional views illustrating the profile of multiple insulator layers at each formation step according to an embodiment of the present invention.
Figure 2B:
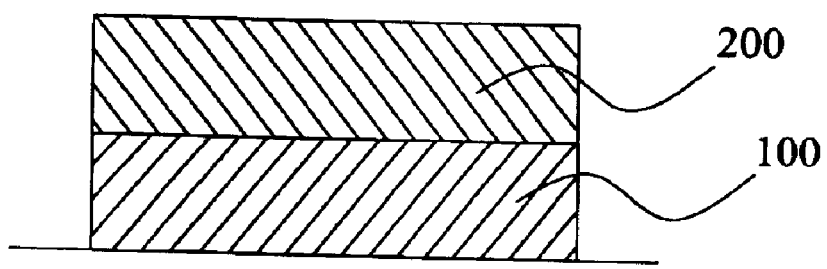
Figure 2C:
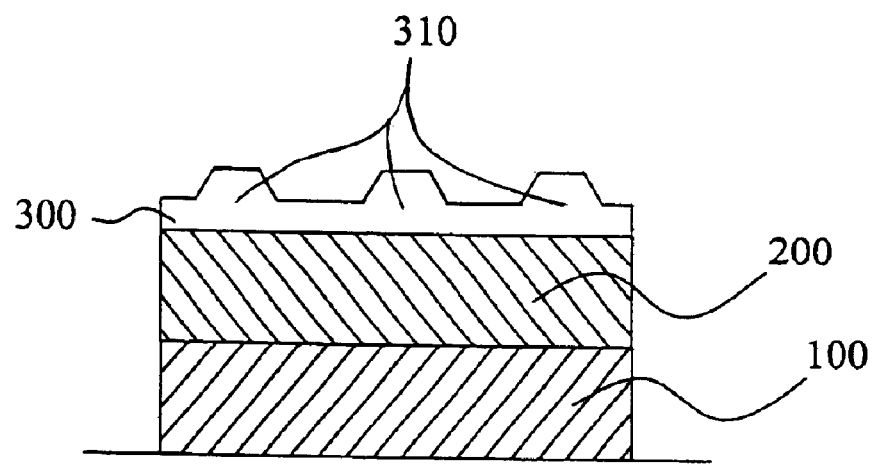
Figure 2D:
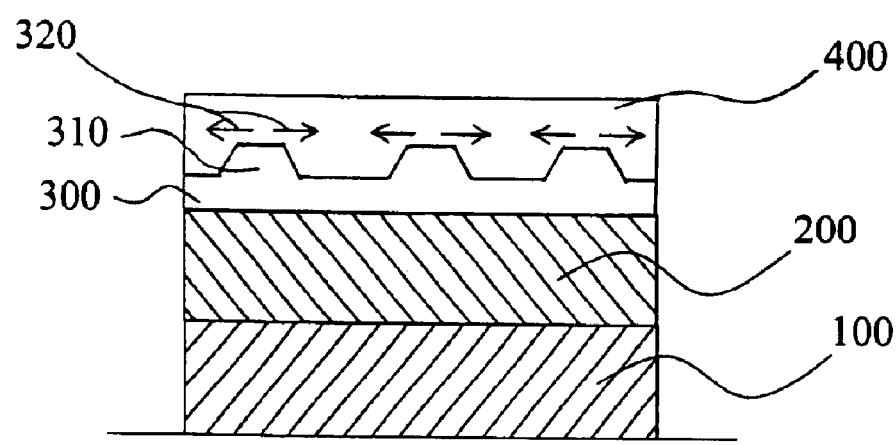

The subsequent step is illustrated in FIG. 2C. In the FIG. 2C, a first quantum dot layer 300 having crystal points is formed on the buffer layer 200 made of epitaxial silicon via appropriate semiconductor manufacturing process. The first quantum dot layer 300 is made by germanium. The first quantum dot layer 300 further comprises a plurality of first crystal points 310. The plurality of first crystal points 310 are self-assembled quantum dots and have island shaped extrusions. The structure of the quantum crystal points 310 is extruding and is not limited to the shape as islands. The island shape is only provided as a specific example in the embodiment. Then, a first coplanar intermediate layer 400 formed on the first quantum dot layer 300 having crystal points is illustrated in FIG. 2D. A corresponding strain field 320 is generated on the first intermediate layer 400 by the crystal points 310. The corresponding strain field 320 is generated due to the fact that the germanium atom has large radium, and the strain field having different tensile stress is generated on the self-assembled quantum dots.

Figure 2E:
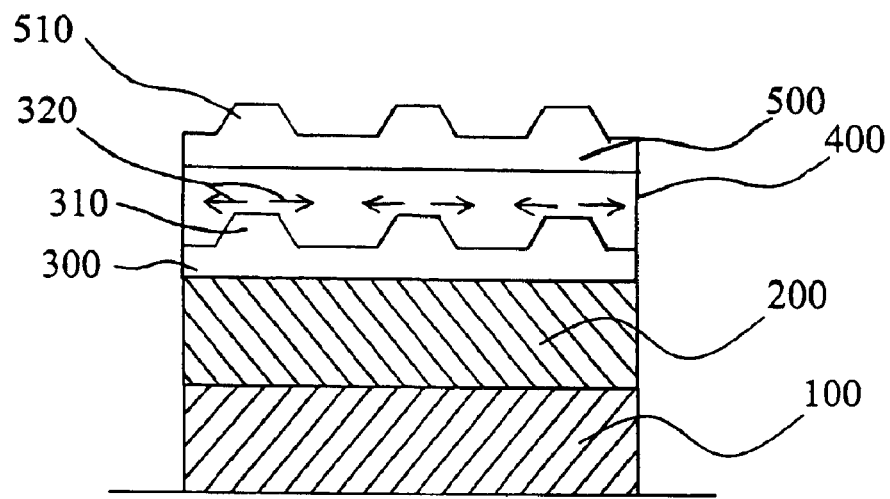
Figure 2F:
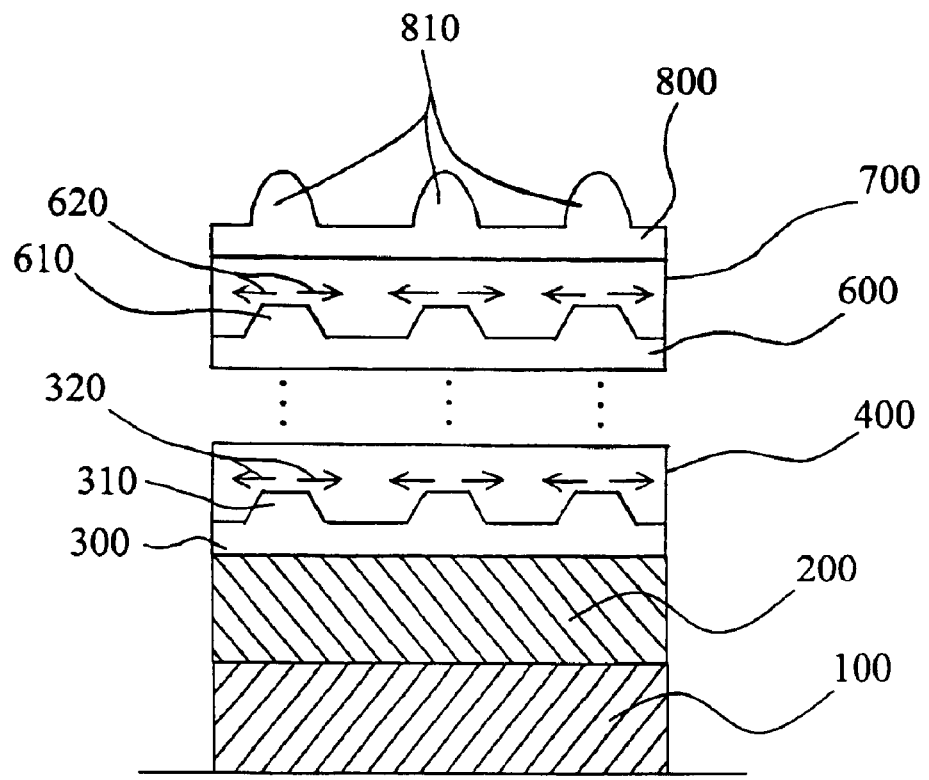

Then, repeat the step occurred in FIGS. 2C and 2D, a plurality of quantum dot layers are formed as shown in FIG. 2E. Also, a plurality of self-assembled quantum crystal points 510 are formed on the quantum dot layers 500 and generate different stress between different intermediate layers. However, different intermediate layers are all made of silicon. A silicon coverage layer 700 is formed on a upper quantum dot layer 600 having crystal points as shown in FIG. 2F. Also, the upper quantum dot layer 600 having crystal points further comprises a plurality of upper crystal points 610. Due to the difference of the atom volumes (about 4.2%) of the plurality of the upper crystal points 610, the crystal points in each quantum dot layer having crystal points generates each own strain field. Each strain field has different effects on the intermediate layers. A silicon coverage layer 700 also is served as an intermediate layer due to the fact that the silicon coverage layer 700 and intermediate layers are both made of silicon. As a result, the upper strain field 620 has an effect on the silicon coverage layer 700. In addition, the upper strain field 620 has an effect on multiple oxidation layers 800 formed on the silicon coverage layer 700. A plurality of oxidation products 810 are deposited on the multiple oxidation layers 800 by LPD. Accordingly, multiple-thickness insulator layers are fabricated by applying different deposition time and strain field.

The method for fabricating multiple-thickness insulator layers is described in details according to the aforementioned embodiment of the present invention. The method for fabricating multiple insulator layers of the present invention can be applied to the semiconductor manufacturing process of nano-electronics components. The present invention does not only upgrade the manufacturing process of the nano-electronics components, also it can be applied in the manufacturing process of light detectors for increasing the performance of the light detectors.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method for fabricating multiple insulator layers, alternating a develop mechanism of insulator layers via strain field generated by stress, the method comprises:

providing a P-type or N-type fabricating material;

forming a buffer layer on the P-type or N-type fabricating material;

forming a quantum dot layer comprising crystal points on a buffer layer, the crystal points being shaped as an island;

depositing a intermediate layer, the intermediate layer being coplanar, the crystal points having different strain field;

forming continuously at least one quantum dot layer comprising crystal points, then depositing at least one intermediate layer on the quantum dot layer;

depositing a silicon coverage layer on the quantum dot layer comprising the crystal points, the silicon coverage layer being coplanar;

wherein multiple insulator layers are deposited on the silicon coverage layer via different tensile stress generated.

2. The method for fabricating multiple insulator layers of claim 1, wherein the P-type or N-type fabricating material is made of a material selected from the group consisting of carbon family, silicon family, germanium family and tin family, and doped with materials of trivalent elements.

3. The method for fabricating multiple insulator layers of claim 1, wherein the buffer layer is made of epitaxial silicon.

4. The method for fabricating multiple insulator layers of claim 1, wherein the quantum dot layer comprising the crystal points is made of germanium crystal.

5. The method for fabricating multiple insulator layers of claim 1, wherein the crystal points are self-assembled germanium quantum dots.

6. The method for fabricating multiple-thickness insulator layers of claim 1, wherein said at least one intermediate layers are made of silicon crystal.

7. The method for fabricating multiple-thickness insulator layers of claim 1, wherein the multiple-thickness insulator layers comprises a plurality of insulators.

8. The method for fabricating multiple-thickness insulator layers of claim 1, wherein the crystal points generates strain field corresponding to the intermediate layer, and corresponding insulators are generated via the different strain field.

9. An assembly having multiple-thickness insulator layers comprises:

a P-type or N-type fabricating material as a substrate;

a buffer layer, disposed on the P-type or N-type fabricating material;

at least one quantum dot layer comprising crystal points, formed on the buffer layer;

at least one intermediate layer, disposed on the quantum dot layer;

a silicon coverage layer, disposed on one of said at least one quantum dot layer;

a multiple-thickness oxidation layer, disposed on the silicon coverage layer;

wherein the crystal points on the said plurality of quantum dot layers provide corresponding strain field, and oxidation products in the multiple-thickness oxidation layer are generated by the strain field.

10. The assembly having multiple-thickness insulator layers of claim 9, wherein the P-type or N-type fabricating material is made of a material selected from the group consisting of carbon family, silicon family, germanium family and tin family, and doped with materials of trivalent elements.

11. The assembly having multiple-thickness insulator layers of claim 9, wherein the buffer layer is made of epitaxial silicon.

12. The assembly having multiple-thickness insulator layers of claim 9, wherein the quantum dot layer comprising the crystal points is made of germanium crystal.

13. The assembly having multiple-thickness insulator layers of claim 9, wherein the crystal points are self-assembled germanium quantum dots.

14. The assembly having multiple-thickness insulator layers of claim 9, wherein said at least one intermediate layers are made of silicon crystal.

15. The assembly having multiple-thickness insulator layers of claim 9, wherein the multiple insulator layers comprises a plurality of insulators.

16. The assembly having multiple-thickness insulator layers of claim 9, wherein the crystal points generate strain field corresponding to the intermediate layer, and corresponding insulators are generated via the different strain field.

* * * * *